United States Patent
Bang

(10) Patent No.: US 7,202,131 B2
(45) Date of Patent: Apr. 10, 2007

(54) METHOD OF FABRICATING SEMICONDUCTOR DEVICE

(75) Inventor: Ki Wan Bang, Choongcheongbukdo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/027,841

(22) Filed: Dec. 29, 2004

(65) Prior Publication Data

US 2005/0142785 A1 Jun. 30, 2005

(30) Foreign Application Priority Data

Dec. 31, 2003 (KR) .................. 10-2003-0101540

(51) Int. Cl.
*H01L 21/336* (2006.01)
(52) U.S. Cl. ............... 438/289; 438/197; 438/199; 257/E21.633
(58) Field of Classification Search .............. None
See application file for complete search history.

(56) References Cited

U.S. PATENT DOCUMENTS

| | | | |
|---|---|---|---|
| 3,859,222 A | 1/1975 | Squillace et al. | |
| 5,384,279 A | 1/1995 | Stolmeijer et al. | |
| 5,698,461 A | 12/1997 | Liu | |
| 5,707,901 A * | 1/1998 | Cho et al. ............... | 438/595 |
| 5,750,430 A | 5/1998 | Son | |
| 5,786,256 A | 7/1998 | Gardner et al. | |
| 5,856,225 A | 1/1999 | Lee et al. | |
| 5,877,056 A | 3/1999 | Wu | |
| 5,960,270 A | 9/1999 | Misra et al. | |
| 6,117,739 A | 9/2000 | Gardner et al. | |
| 6,159,808 A | 12/2000 | Chuang | |
| 6,177,336 B1 | 1/2001 | Lin et al. | |
| 6,180,468 B1 | 1/2001 | Yu et al. | |
| 6,200,865 B1 | 3/2001 | Gardner et al. | |
| 6,204,148 B1 | 3/2001 | Gardner et al. | |
| 6,251,760 B1 | 6/2001 | Son | |
| 6,300,201 B1 | 10/2001 | Shao et al. | |
| 6,344,397 B1 | 2/2002 | Horstmann et al. | |
| 6,395,606 B1 * | 5/2002 | Huster et al. ............... | 438/289 |
| 6,410,394 B1 | 6/2002 | Shao et al. | |
| 6,512,273 B1 * | 1/2003 | Krivokapic et al. ........ | 257/369 |
| 6,518,113 B1 | 2/2003 | Buynoski | |
| 6,767,780 B2 * | 7/2004 | Sohn et al. .................. | 438/217 |
| 6,777,281 B1 * | 8/2004 | Kadosh et al. .............. | 438/199 |
| 2002/0137294 A1 | 9/2002 | Wu et al. | |
| 2003/0141549 A1 * | 7/2003 | Miyano et al. ............. | 257/368 |
| 2004/0018689 A1 | 1/2004 | Kim | |
| 2005/0040479 A1 * | 2/2005 | Koldiaev et al. ........... | 257/411 |

* cited by examiner

*Primary Examiner*—Michael Lebentritt
*Assistant Examiner*—Cheung Lee
(74) *Attorney, Agent, or Firm*—Andrew D. Fortney

(57) ABSTRACT

A method of fabricating a semiconductor device is provided, by which leakage current is reduced by minimizing electron or hole density in a source/drain forming a P/N junction with a transistor channel area. The method includes forming a gate insulating layer on a semiconductor substrate, forming a channel ion area in the substrate, forming a gate electrode on the gate insulating layer, forming a sidewall insulating layer on the gate electrode, forming lightly doped regions in the substrate adjacent to the channel ion area and aligned with the gate electrode, forming a spacer insulating layer on the sidewall insulating layer, forming spacers on sidewalls of the gate electrode, and forming heavily doped regions in the substrate aligned with the spacer.

20 Claims, 4 Drawing Sheets

METHOD OF FABRICATING SEMICONDUCTOR DEVICE

This application claims the benefit of the Korean Application No. P2003-0101540 filed on Dec. 31, 2003.

BACKGROUND OF THE INVENTION

1. Field of the Invention

The present invention relates to a method of fabricating a semiconductor device, by which leakage current is reduced by minimizing electron or hole density in a source/drain forming a P/N junction with a channel area of a transistor.

2. Discussion of the Related Art

Generally, as a semiconductor size is reduced according to a highly increasing degree of semiconductor device integration, a channel length of a semiconductor device is reduced as well. The characteristics of the semiconductor device can be balanced only if the dimensional reduction of the semiconductor is horizontally and vertically made. If such a requirement for the dimensional reduction of the semiconductor device fails to be met, a channel length between source and drain is shortened to result in unfavorable variations of the semiconductor device characteristics such as the short channel effect (SCE).

To overcome the short channel effect, a horizontal reduction in a gate electrode width and the like needs to be simultaneously made together with a vertical reduction in gate insulating layer thickness, source/drain junction depth, and the like. Moreover, according to the horizontal and vertical reductions, a voltage of a power source is lowered, a doping density of a semiconductor substrate is raised, and more specifically, a doping profile in a channel area should be efficiently controlled.

Yet, since the operational power requested by an electronic product is still high despite the dimensional reduction of the semiconductor device, electrons injected from a source of an NMOS transistor are severely accelerated in a potential gradient state of a drain to make the NMOS transistor vulnerable to hot carrier generation for example. To overcome such a problem, an LDD (lightly doped drain) structure improving the NMOS transistor vulnerable to hot carriers has been proposed.

In a transistor of the LDD structure, a lightly doped region (n−) lies between a channel and a heavily doped drain/source (n+) to buffer a high drain voltage in the vicinity of the drain junction. Hence, the lightly doped region interrupts the abrupt potential variation to suppress the hot carrier generation. Since many efforts have been made to development of a highly increased degree of semiconductor device integration, various methods for fabrication LDD MOSFET have been proposed. One of the various methods is an LDD fabrication method using a spacer provided to a sidewall of a gate electrode, which is currently and mostly adopted as a method for mass production.

A method of fabricating a semiconductor device having an LDD structure according to a related art is explained as follows.

FIG. 1A and FIG. 1B are cross-sectional diagrams for explaining a method of fabricating a semiconductor device having an LDD structure according to a related art.

Referring to FIG. 1A, a device isolation layer 102 is formed on a field area of a semiconductor substrate 101 to define an active area of the semiconductor substrate 201 such as a P type silicon substrate 101.

Channel ions for threshold voltage adjustment of a channel area are implanted into a surface of the semiconductor substrate 101 to form a channel ion region 104.

A gate oxide layer 103, e.g., an oxide layer 103, is grown on the active area of the semiconductor substrate 101 by thermal oxidation.

A polysilicon layer is deposited on the gate insulating layer 103 and is then patterned by photolithography to form a pattern of a gate electrode 105.

Subsequently, LDD ion implantation is carried out on the substrate 101 to form a pair of lightly doped regions 106 for an LDD structure aligned with the pattern of the gate electrode 105.

Referring to FIG. 1B, a sidewall insulating layer 106, e.g., a TEOS oxide layer, is deposited over the substrate 101 including the gate electrode 105 and the active area.

And, an insulating layer 107, e.g., a nitride layer 107, for a spacer is deposited on the sidewall insulating layer 106.

The insulating layer 107 is etched back to form a spacer 108 on a sidewall of the gate electrode 105.

Subsequently, source/drain ion implantation is carried out on the substrate 101, whereby a pair of heavily doped regions in the active area of the substrate 201 to be aligned with the spacer 108. Hence, self-aligned N type source S and drain D are formed in the active area of the substrate 101.

Thereafter, the sidewall insulating layer 106 is removed by wet etch to expose a topside of the gate electrode 105 and surfaces of the source S and drain D.

However, in the transistor fabricated by the related art method, the channel ion region and the source/drain region configure a P/N junction which becomes in a reverse bias state on operating the transistor. And, a depletion area having no electron or hole exists in the P/N junction area. Moreover, it is highly probable that leakage current is generated from the depletion area by an electric field.

Meanwhile, amplitude of the electric field is proportional to density of electrons or holes. In order to minimize the leakage current occurrence in the depletion area, the electric field of the corresponding area needs to be lowered. And, the density of electrons or holes should be lowered to reduce the electric field.

SUMMARY OF THE INVENTION

Accordingly, the present invention is directed to a method of fabricating a semiconductor device that substantially obviates one or more problems due to limitations and disadvantages of the related art.

An object of the present invention is to provide a method of fabricating a semiconductor device, by which leakage current is reduced in a manner of minimizing electron or hole density in forming a source/drain configuring a P/N junction with a channel area of a transistor.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a semiconductor device according to the present invention includes the steps of forming a gate insulating layer on a semiconductor substrate, forming a channel ion area in the substrate, forming a gate electrode on the gate insulating layer, forming a sidewall insulating layer on the gate electrode, forming lightly doped regions in the substrate adjacent to the channel ion region and aligned with the gate electrode, forming a spacer insulating layer on the sidewall insulating layer, forming spacers on sidewalls of the gate electrode by etching the spacer insulating layer and the sidewall insulating layer, and forming heavily doped regions in the substrate aligned with the spacers.

Preferably, forming the channel ion area comprises implanting impurity ions at a dose of 1E12~1E14 ions/cm$^2$ into the substrate.

Preferably, the sidewall insulating layer comprises an oxide (e.g., silicon dioxide).

Preferably, the method further includes the step of implanting ions at a low dose into the substrate (including the gate electrode) prior to forming the sidewall insulating layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2E are cross-sectional diagrams for explaining a method of fabricating a semiconductor device having an LDD structure according to the present invention.

Figure 1A:
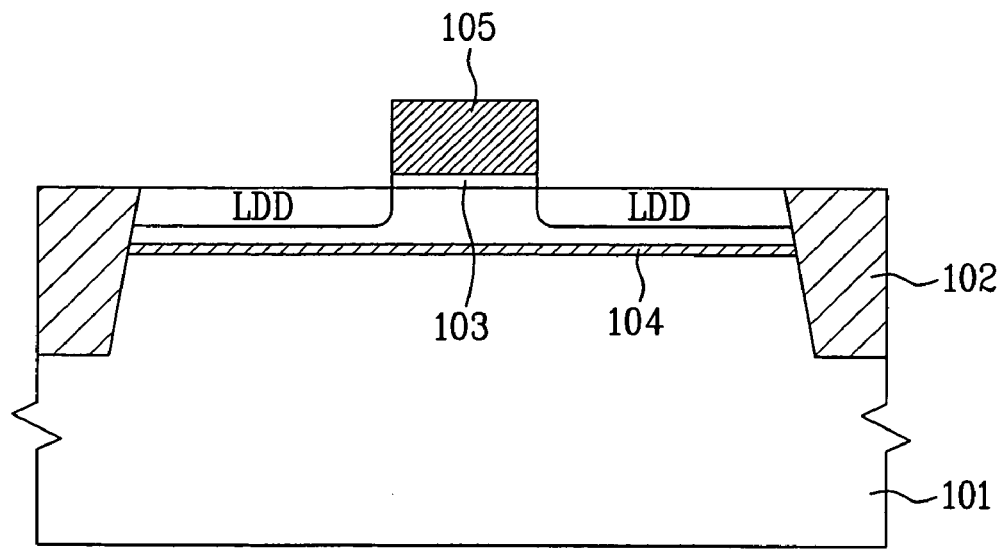
FIG. 1A and FIG. 1B are cross-sectional diagrams for explaining a method of fabricating a semiconductor device having an LDD structure according to a related art.
Figure 1B:
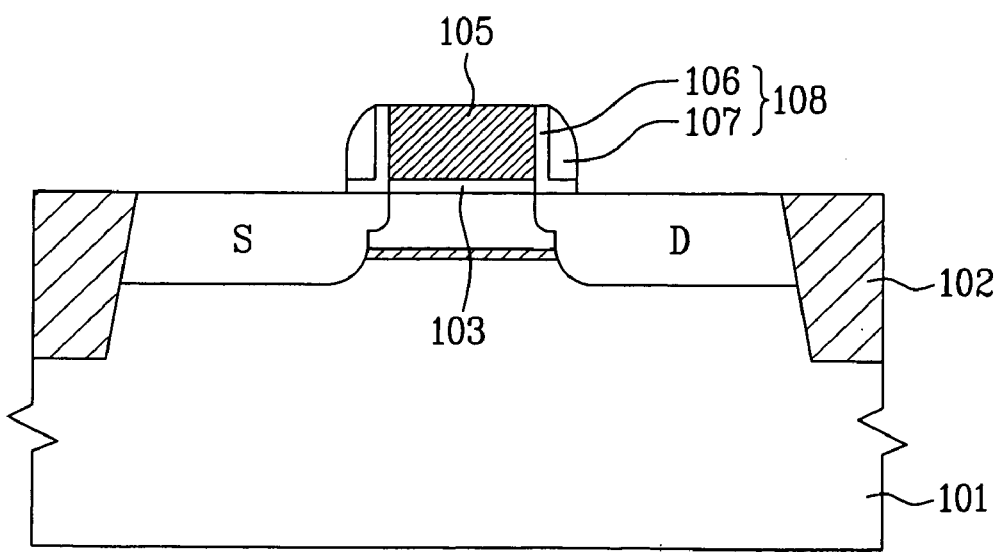
Figure 2A:
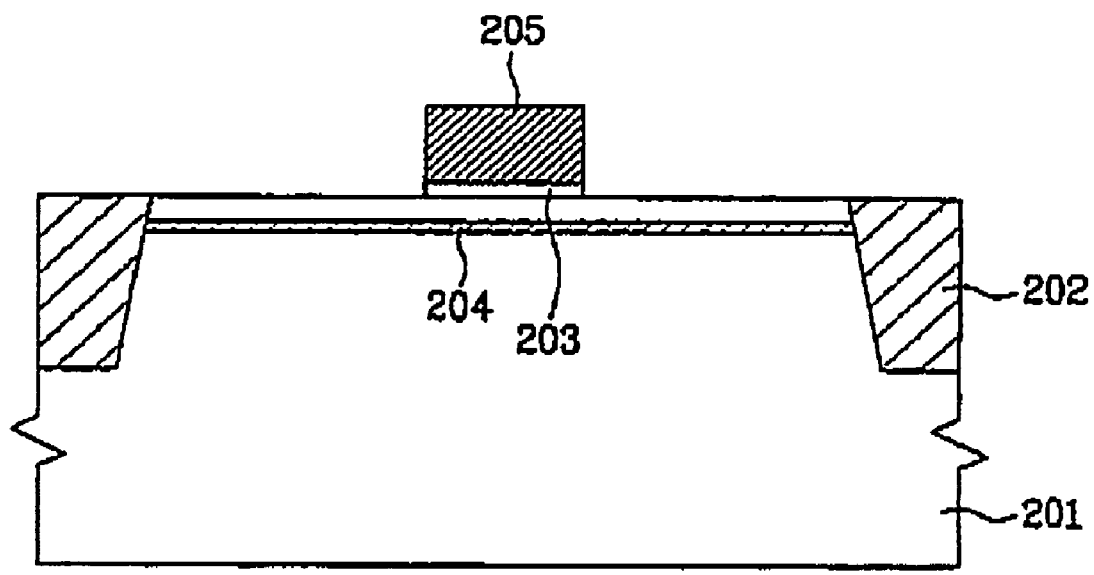
FIGS. 2A to 2E are cross-sectional diagrams for explaining a method of fabricating a semiconductor device having an LDD structure according to the present invention.

Referring to FIG. 2A, a device isolation layer 202 is formed on a field area of a semiconductor substrate 201 by STI (shallow trench isolation) or the like to define an active area of the substrate 201. In doing so, a first conductive type (N or P) single crystalline silicon substrate may be used as the semiconductor substrate 201. For convenience of explanation, it is assumed that a first conductive type indicates an N type in the following.

A gate oxide layer is grown on the active area of the semiconductor substrate 201 by thermal oxidation.

Channel ions for threshold voltage adjustment of a channel area are implanted into a surface of the semiconductor substrate 201 at a dose of from about 1E12 to about 1E14 ions/cm$^2$ using a dopant such as BF$_2$ ion and the like to form a channel ion region 204.

A gate insulating layer 203 is grown on the active area of the semiconductor substrate 201 by thermal oxidation (which may comprise wet or dry thermal oxidation).

A conductor layer for a gate electrode is deposited on the gate insulating layer 203 by LPCVD (low pressure chemical vapor deposition).

Photoresist is coated on the conductor layer. Exposure and development are carried out on the photoresist to form a photoresist pattern (not shown in the drawing) corresponding to a gate forming area.

The conductor layer and the gate insulating layer are etched using the photoresist pattern as an etch mask until the active area of the semiconductor substrate 201 is exposed. Hence, a gate electrode 205 and a gate insulating layer 203 are formed on the active area of the substrate 201.

Figure 2B:
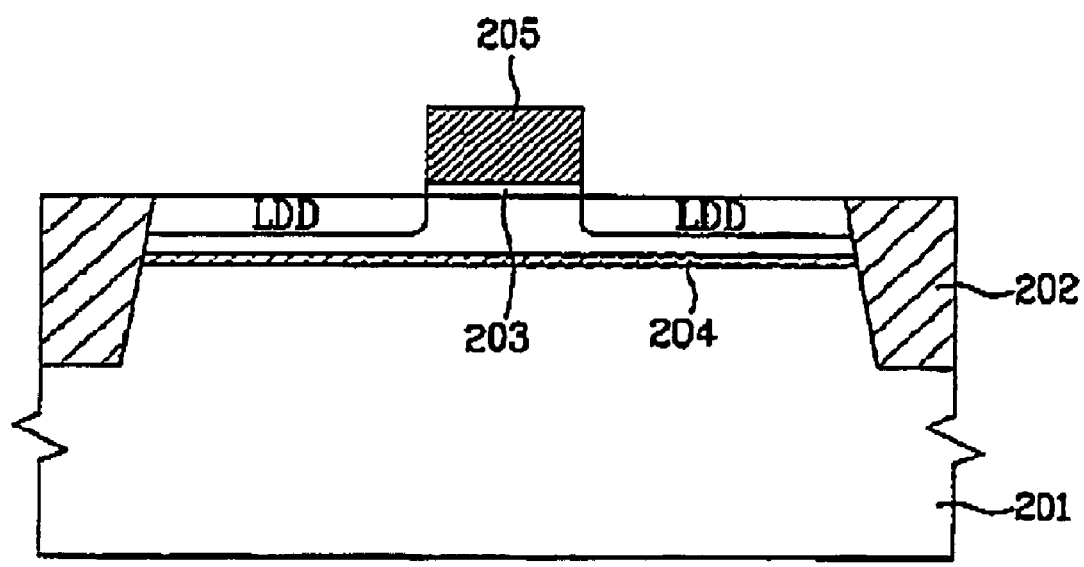
Figure 2C:
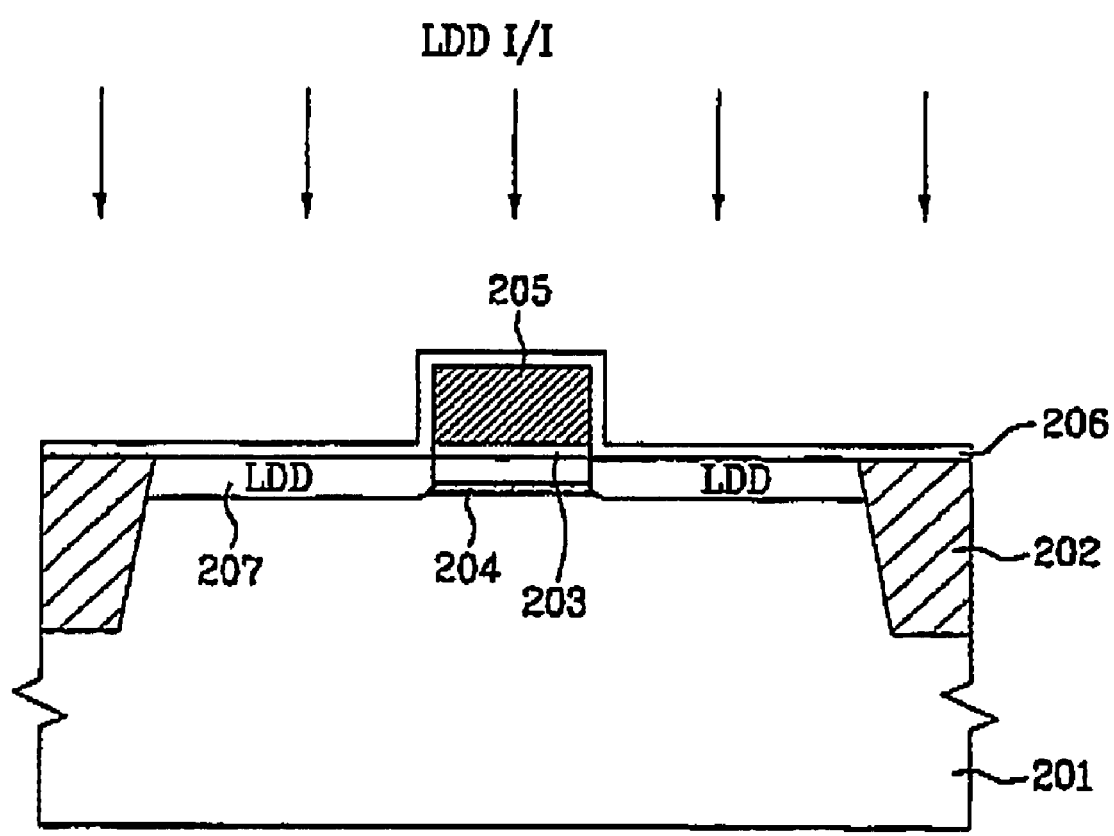

Referring to FIG. 2C, a sidewall insulating layer 206, e.g., an oxide layer, is deposited about 50~200 Å thick over the substrate 201 including the gaw electrode 205. In doing so, a TEOS layer (which forms silicon dioxide during the deposition process) can be used as the oxide layer 206.

Subsequently, LDD ion implantation is carried out on the substrate 201 to form a pair of lightly doped regions 207 for an LDD structure aligned with the gate electrode 205. In doing so, the LDD ion implantation is carried out at a dose of from about 1E14 to about 1E15 ions/cm$^2$ using a second conductive type dopant such as boron (B) ions. The lightly doped regions 207 are annealed to form a pair of LDD regions. Hence, the LDD region and the channel ion region 204 configure or form a P/N junction.

Optionally, and as shown in FIG. 2B, prior to forming the sidewall insulating layer 206, to related art LDD ion implantation can be further carried out using the gate electrode 205 as an ion implantation mask. Namely, first LDD ion implantation is carried out prior to forming the sidewall insulating layer 206. And, as showen in FIG. 2C, second LDD ion implantation is carrried out after forming the sidewall insulating layer 206.

Figure 2D:
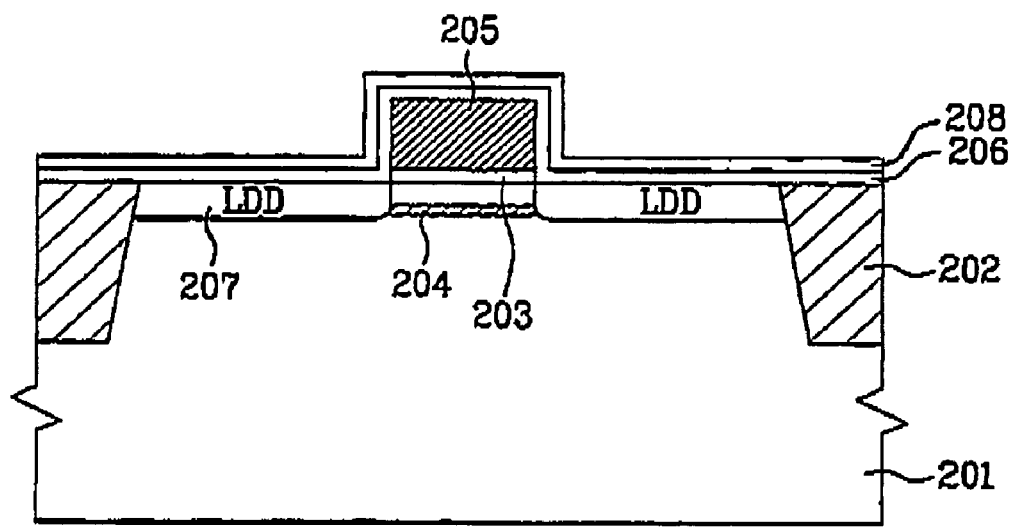

Referring to FIG. 2D, a nitride layer 208 for a spacer is deposited about 200–500 Å thick on the sidewall insulating layer 206.

The insulating layer 107 is etched back (preferably anisotropically) to form a spacer 108 on a sidewall of the gate electrode 105.

Figure 2E:
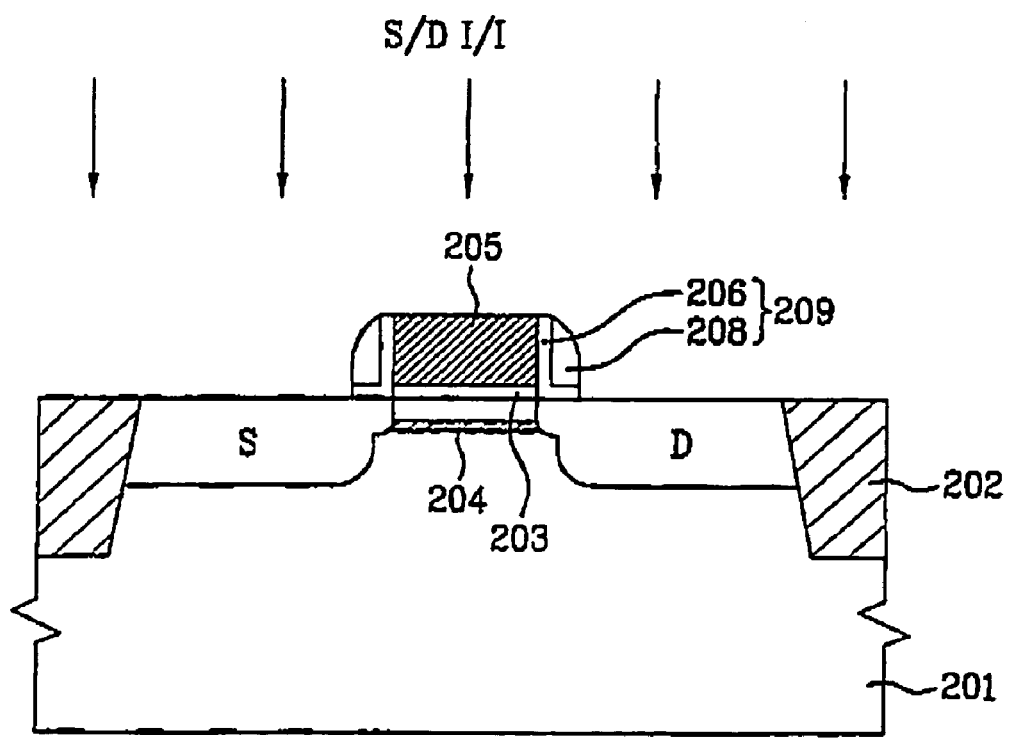

Referring to FIG. 2E, the nitride layer 208 and the sidewall insulating layer 206 are etched back by dry etch such as RIE (reactive ion etch) until surfaces of the gate electrode 205 and the active area of the substrate 201 arc exposed. Hence; the sidewall insulating and nitride layers 206 and 208 remain on a sidewall of the gate electrode 205 to configure a spacer 209.

Subsequently, source/drain ion implantation is carried out on the substrate 201 to form source/drain regions aligned with the spacer 209. In doing so, the source/drain ion implantation is carried out at a dose of 1E15~5E15 ions/cm$^2$ using a second conductive type (p type) dopant such as B$^+$ and/or BF$^{2+}$ ions. And, the substrate 201 is annealed by rapid thermal processing or the like to activate the dopant in the lightly and heavily doped regions. In doing so, the annealing is carried out at an ambience of inert gas at a temperature of from about 800 to about 1,000° C. for 10~30 seconds.

Thereafter, salicidation is carried out on the substrate to form a silicide layer on the gate electrode 205 and the source/drain regions S and D.

In the structure of the above-fabricated semiconductor device, an area configuring the P/N junction with the channel ion region 204 is not the heavily doped source/drain region but the LDD region. Hence, an electric field in the depletion area existing in the P/N junction area is weakened to minimize the occurrence of leakage current.

Accordingly, by the present invention, the area configuring the P/N junction with the channel ion region 204 is set to the LDD region, whereby the electric field in the depletion area existing in the P/N junction area is weakened to considerably lower the possibility of leakage current generation.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor device, comprising the steps of:
    forming a gate insulating layer on a semiconductor substrate;
    after forming said gate insulating layer, forming a channel ion area in the substrate;
    after forming said channel ion area, forming a gate electrode on the gate insulating layer;
    implanting first ions at a low dose in to substrate using the gate electrode as a mask prior to forming a sidewall insulating layer or a spacer on sidewalls of the gate electrode;
    after implanting said first ions, forming the sidewall insulating layer on the gate elcetrode;
    implanting second ions at a low dose into the substrate to form lightly doped regions in the substrate adjacent to the channel ion area and aligned with to gate electrode;
    forming a spacer insulating layer on the sidewall insulating layer
    forming spacers on sidewalls of the gate electrode by etching to spacer insulating layer and the sidewall insulating layer; and
    forming heavily doped regions in the substrate aligned wit the spacers.

2. The method of claim 1, wherein forming the channel ion area comprises implanting impurity ions at a dose of $1E12\sim1E14$ ions/cm$^2$ into the substrate.

3. The method of claim 2, wherein implanting impurity ions comprises implanting $BF_2$ ions.

4. The method of claim 1, wherein the sidewall insulating layer comprises an oxide.

5. The method of claim 1, further comprising forming a device isolation layer by a shallow trench isolation process.

6. The method of claim 1, wherein forming the gale insulating layer comprises a thermal oxidation process.

7. The method of claim 1, wherein forming the gate electrode comprises depositing a conductive layer by LPCVD.

8. The method of claim 7, wherein forming the gate electrode comprises etching the conductive layer and the gate insulating layer until an active area of the semiconductor substrate is exposed.

9. The method of claim 1, wherein forming the sidewall insulating layer comprises depositing an oxide layer.

10. The method of claim 1, wherein forming the sidewall insulating layer comprises depositing a TEOS layer.

11. The method of claim 1, wherein forming the sidewall insulating layer comprises depositing an insulating material to a thickness of 50 ~200 Å.

12. The method of claim 1, wherein the substrate comprises a first conductive type single crystalline silicon substrate, and implanting the first ions at a low dose comprises implanting second conductive type ions at a dose of $1E14\sim1E15$ ions/em$^2$.

13. The method of claim 1, wherein the substrate comprises a first conductive type single crystalline silicon substrate, and implanting second ions into the substrate to form lightly doped regions in the substrate comprises implanting second conductive type ions at a dose of $1E14\sim1E15$ ions/cm$^2$.

14. The method of claim 1, wherein forming the spacer insulating layer comprises depositing a nitride layer.

15. The method of claim 1, wherein forming the spacer insulating layer comprises depositing an insulating material to a thickness of 200~500 Å.

16. The method of claim 1, wherein etching the spacer insulating layer and the sidewall insulating layer comprises an etch back process or reactive ion etching.

17. The meted of claim 1, wherein the substrate comprises a first conductive type single crystalline silicon substrate, and forming heavily doped regions in the substrate comprises implanting second conductive type ions at a dose of $1E15\sim1E15$ ions/cm$^2$.

18. The method of claim 1, further comprising annealing the substrate by rapid thermal processing at a temperature of 800–1000° C. for 10–30 seconds after forming heavily doped regions In the substrate.

19. The method of claim 1, further comprising forming a silicide layer on the gate electrode and the heavily doped regions.

20. The method of claim 1, further comprising annealing the semiconductor substrate after implanting second ions to form LDD regions.

* * * * *